United States Patent
Tung

(10) Patent No.: US 9,274,413 B2
(45) Date of Patent: Mar. 1, 2016

(54) METHOD FOR FORMING LAYOUT PATTERN

(71) Applicant: UNITED MICROELECTRONICS CORP., Hsin-Chu (TW)

(72) Inventor: Yu-Cheng Tung, Kaohsiung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 24 days.

(21) Appl. No.: 14/023,472

(22) Filed: Sep. 11, 2013

(65) Prior Publication Data

US 2015/0072531 A1   Mar. 12, 2015

(51) Int. Cl.
  H01L 21/311 (2006.01)
  G03F 1/38 (2012.01)
  H01L 21/308 (2006.01)

(52) U.S. Cl.
  CPC .............. *G03F 1/38* (2013.01); *H01L 21/3086* (2013.01)

(58) Field of Classification Search
  None
  See application file for complete search history.

(56) References Cited

U.S. PATENT DOCUMENTS

| | | | |
|---|---|---|---|
| 6,081,272 A | 6/2000 | Morimoto | |
| 6,521,969 B1 | 2/2003 | Tomita | |
| 6,680,539 B2 | 1/2004 | Nohsoh | |
| 7,247,887 B2 | 7/2007 | King | |
| 8,142,986 B2* | 3/2012 | Sim et al. | 430/313 |
| 8,151,222 B2* | 4/2012 | Kim | 716/54 |
| 8,178,289 B2 | 5/2012 | Chen | |
| 8,975,178 B2* | 3/2015 | Kikutani et al. | 438/624 |
| 2003/0204832 A1 | 10/2003 | Matumoto | |
| 2007/0020565 A1 | 1/2007 | Koh | |
| 2007/0158756 A1 | 7/2007 | Dreeskornfeld | |
| 2008/0248429 A1 | 10/2008 | Chou | |
| 2009/0233238 A1 | 9/2009 | Hsu | |
| 2009/0258500 A1 | 10/2009 | Yang | |
| 2011/0012237 A1* | 1/2011 | Pierrat | 257/618 |
| 2012/0329266 A1 | 12/2012 | Hiramoto | |
| 2013/0230988 A1* | 9/2013 | Shini | 438/703 |
| 2013/0234301 A1* | 9/2013 | Wang et al. | 257/635 |
| 2014/0057436 A1* | 2/2014 | Chen et al. | 438/675 |
| 2014/0339641 A1* | 11/2014 | Hong et al. | 257/368 |
| 2015/0056724 A1* | 2/2015 | Shieh et al. | 438/14 |

* cited by examiner

*Primary Examiner* — David E Graybill
(74) *Attorney, Agent, or Firm* — Winston Hsu; Scott Margo

(57) ABSTRACT

A method for forming a layout pattern includes the following processes. First, a first layout pattern consisting of mandrel patterns and dummy mandrel patterns, a second layout pattern consisting of geometric patterns, and a third layout pattern consisting of pad patterns and dummy pad patterns, are respectively defined on a first mask, a second mask, and a third mask. Then, the first layout pattern is transferred to form a first patterned layer. Afterwards, spacers having a first critical dimension are formed on the sidewalls of the first patterned layer so as to constitute loop-shaped patterns. Then, the third layout pattern is transferred to form a second patterned layer having a second critical dimension, wherein the second critical dimension is greater than the first critical dimension. Finally, the loop-shaped patterns, the pad patterns, and the dummy pad patterns are transferred into a target layer on the substrate.

11 Claims, 11 Drawing Sheets

METHOD FOR FORMING LAYOUT PATTERN

BACKGROUND OF THE INVENTION

1. Field of the Invention

The present invention generally relates to the field of layout patterns in semiconductor devices, and more particularly to a method for forming a layout pattern in non-planar semiconductor devices.

2. Description of the Prior Art

Integrated circuits (IC) are made of devices and interconnections, which are formed through patterned features in different layers. During the fabrication process of ICs, the photolithography is an essential technique. The photolithography is used to form designed patterns, such as implantation patterns or layout patterns, on at least a photomask, and then to precisely transfer such patterns to a photoresist layer through exposure and development steps. Finally, by performing several semiconductor processes such as etching processes, ion implantations, depositions and so forth, complicated and sophisticated IC structures can be obtained.

With the continuous miniaturization of semiconductor devices and the remarkable advance in fabrication techniques of semiconductor devices, the conventional lithography process meets its limitation due to printability and manufacturability problems. To meet the requirements of device design rules which continue to push the resolution limits of existing processes and tooling, a double patterning technique (DPT) has been developed and taken as one of the most promising lithography technologies for 32 nanometer (nm) node and 22 nm node patterning, since it can increase the half-pitch resolution up to twice higher by using current infrastructures. Besides, three-dimensional or non-planar transistor technology, such as the fin field effect transistor (FinFET) technology, has also been developed to replace planar MOS transistors. Generally, patterned structures in a FinFET, such as fin structures, can be obtained by sidewall image transfer (SIT).

Although the above-mentioned technologies, i.e. DPT and 3-D transistor technology, have been widely adopted by semiconductor manufacturers and successively overcome major drawbacks in the fabricating process, there are still some problems needed to be solved. For example, in order to prevent or overcome optical problems, such as optical proximity effect, in photolithography processes and polishing problems, such as dishing phenomenon, in planarization processes, dummy patterns are often added to layout patterns of semiconductor devices through proper computer simulation at the beginning of the fabrication process. However, how to effectively distribute different dummy patterns over individual photomasks is still a major topic for study in the semiconductor field.

SUMMARY OF THE INVENTION

One object of the present invention is to provide a method for forming a layout pattern so as to solve the problems of the conventional techniques.

According to one embodiment of the present invention, a method for forming a layout pattern is provided, which at least includes the following processes. First, a first layout pattern consisting of mandrel patterns and dummy mandrel patterns, a second layout pattern consisting of geometric patterns, and a third layout pattern consisting of pad patterns and dummy pad patterns, are respectively defined on a first mask, a second mask, and a third mask. Then, the first layout pattern is transferred to form a first patterned layer. Afterwards, spacers having a first critical dimension are formed on the sidewalls of the first patterned layer so as to constitute loop-shaped patterns. Then, the third layout pattern is transferred to form a second patterned layer having a second critical dimension, wherein the second critical dimension is greater than the first critical dimension. Finally, the loop-shaped patterns, the pad patterns, and the dummy pad patterns are transferred into a target layer on the substrate.

According to another embodiment of the present invention, a method for forming a layout pattern is provided, which at least includes the following processes: (a) forming loop-shaped patterns consisting of loop-shaped feature patterns and loop-shaped dummy patterns in a layer over a substrate, wherein both the loop-shaped feature patterns and the loop-shaped dummy patterns have a first critical dimension; (b) after the step (a), forming geometric patterns consisting of pad patterns and dummy pad patterns in another layer over the substrate, wherein the dummy pad patterns have a second critical dimension and the second critical dimension is greater than the first critical dimension.

According to still another embodiment of the present invention, a mask set for defining a layout pattern is provided. The mask set includes a first mask, a second mask, and a third mask respectively include a first layout pattern, a second layout pattern, and a third layout pattern. The first layout pattern includes mandrel patterns and dummy mandrel patterns. The second layout pattern includes geometric patterns which cover portions of the mandrel patterns and portions of the dummy mandrel patterns. The third layout pattern includes pad patterns and dummy pad patterns. The dummy pad patterns are laterally spaced apart from the mandrel patterns and the dummy mandrel patterns.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
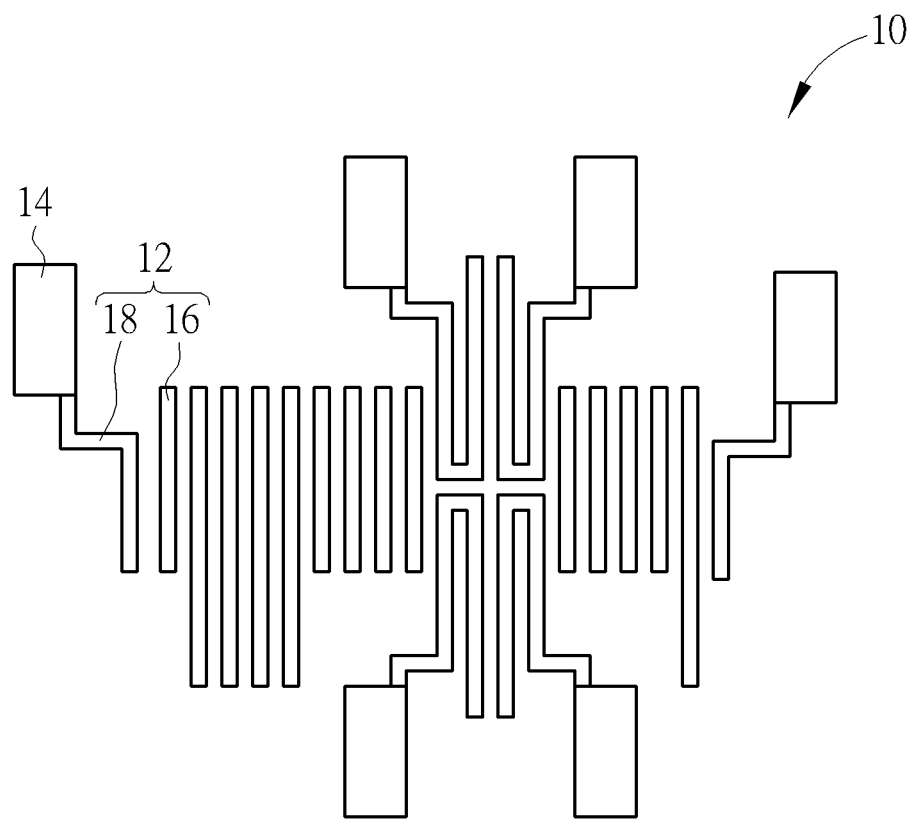
FIG. 1 to FIG. 10 are schematic diagrams showing a method for forming a layout pattern on a substrate by sidewall image transfer (SIT) technology according to embodiments of the present invention.

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the structures or apparatus are not to scale and some dimensions are exaggerated for clarity of presentation. Also, where multiple embodiments are disclosed and described as having some features in common, like or similar features will usually be described with same reference numerals for ease of illustration and description thereof.

FIG. 1 to FIG. 10 are schematic diagrams showing a method for forming a layout pattern on a substrate by sidewall image transfer (SIT) technology according to one embodiment of the present invention. FIG. 11 is a simplified flowchart showing a method for forming a layout pattern on a substrate according to one embodiment of the present invention. Please refer to FIG. 1 and FIG. 11; in step S110, an original layout pattern 10 is first provided to a database of a computer system. The original layout pattern 10, which is an ideal designed pattern supposed to be formed in final products, may include feature patterns used to construct integrated circuits (IC) such as device patterns, contact pad patterns, or layout of circuits, but not limited thereto. According to this embodiment, the original layout pattern 10 is classified into at least a first feature pattern 12 and a second feature pattern 14. The first feature pattern 12 may consist of straight line patterns 16 and bent line patterns 18 with the same widths, while the second feature pattern 14 may consist of rectangular pad patterns (not shown) connecting to the corresponding straight line patterns 16 or bent line patterns 18. As depicted in FIG. 1, since the first feature pattern 12 is preferably used to construct active regions in semiconductor devices and the second feature pattern 14 is preferably used to construct interconnection pads, the dimensions of the straight line patterns 16 and the bent line patterns 18 are smaller than those of the pad patterns, but not limited thereto.

After the classification of the original layout pattern 10, step S120 and step S130 are carried out sequentially. More precisely, in step S120, at least a first layout pattern, a second layout pattern, and a third layout pattern are generated and stored in a computer database according to the original layout pattern. In step S130, the first layout pattern, the second layout pattern, and the third layout pattern are respectively defined on a first mask, a second mask, and a third mask. The first mask, a second mask, and a third mask may be used to constitute a mask set according to the present embodiment. After step S120 and step S130, the first layout pattern, the second layout pattern, and the third layout pattern may be further respectively transferred to layers on or over a substrate in the subsequent fabrication process. It should be noted that, since the contour of the layout patterns formed in the layers on or over the substrate usually deviates from what was intended to be formed, a suitable correction method, such as optical proximity correction (OPC), is often carried out to correct them. For example, the usual way of correcting the layout patterns includes an adjustment of the line width of the line segment, and the disposition of printable or non-printable assist patterns, such as serif or hammerhead patterns at the line end or the corner. Alternatively, some of the assist patterns on the individual masks may be disposed apart from adjacent feature patterns. In this way, both the line width adjustment and the use of assist patterns may be successfully used to avoid the deviation of the transferred patterns, such as rounded right-angle corners, shortened line-ends, or increased/decreased line widths when the layout patterns on the corresponding photomasks are later transferred onto the layers on the substrate. Through the OPC process and photomask-making process, the corrected layout patterns are generated and respectively defined on the corresponding photomasks.

For the sake of clarity, the actual layout of the first layout pattern, the second layout pattern and the third layout pattern, and the process for transferring the layout patterns from the masks to the layers on the substrate are described in detail in the following paragraphs.

Figure 2:
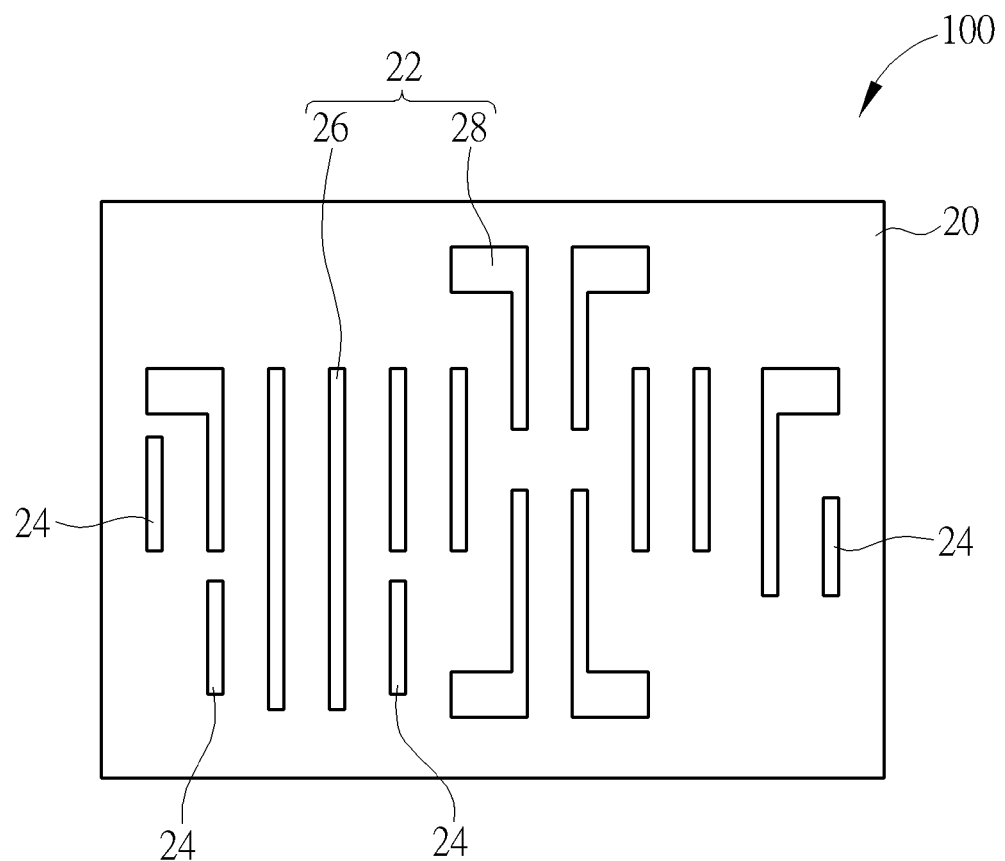

Please refer to FIG. 2. FIG. 2 is a schematic diagram showing a first mask with a first layout pattern. As depicted in FIG. 2, the first layout pattern 100 includes mandrel patterns 22 and dummy mandrel patterns 24. The mandrel patterns 22 may consist of straight line patterns 26 and L-shaped patterns 28. In contrast, the dummy mandrel patterns 24 may only consist of straight line patterns (not shown), but not limited thereto. Preferably, the dimensions of the mandrel patterns 22 are the same as those of the dummy mandrel patterns 24. According to this embodiment, all the dummy mandrel patterns 24 shown in FIG. 2 are printable and have dimensions the same as those of the mandrel patterns 22 according to this embodiment. However, in another case, some of the dummy mandrel patterns may be non-printable so that they would not be transferred to a layer on or over a substrate in the following process. It should be noted that, since the first pattern layout 100 is corrected by the OPC process in advance, the straight line patterns 24 and 26 and L-shaped patterns 28 formed on the first mask 20 would never be perfect straight line patterns and perfect L-shaped patterns, they may have slightly widened line ends and slightly inwards and/or outwards corners instead.

Figure 3:
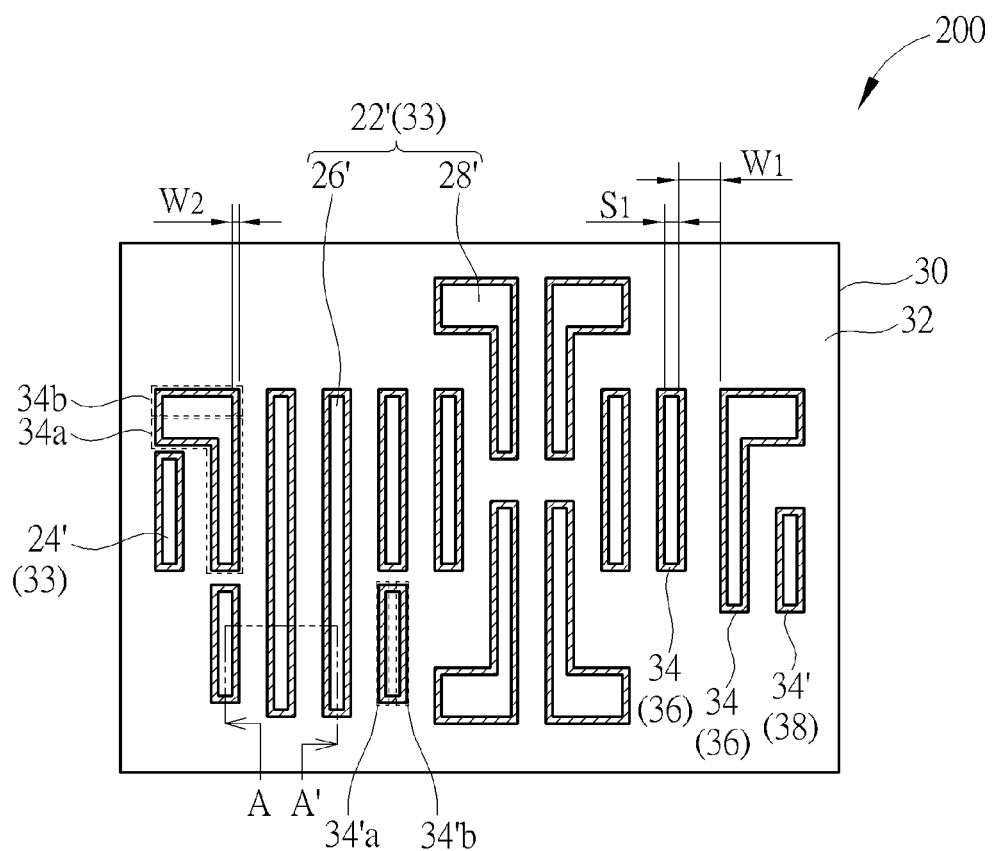
Figure 4:
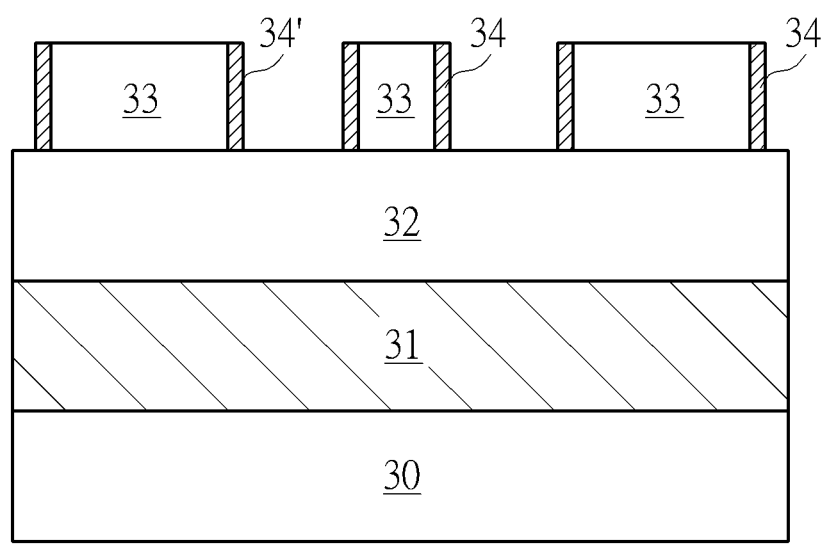

Then, please refer to FIG. 3 and FIG. 4. FIG. 3 is a schematic diagram showing a first layout pattern transferred to a layer over a substrate and surrounded by spacers. FIG. 4 is schematic cross-sectional diagram taken along a line A-A' in FIG. 4. Referring to FIG. 3 and FIG. 4, in step S140, the first layout pattern 100 formed on the first mask 20 is transferred to the layer over the substrate 30. For example, in a case that the substrate 30 is covered by layers including a target layer 31, a hard mask layer 32, and a sacrificial layer (not shown), the first layout pattern 100 may be transferred from the first mask 20 to the sacrificial layer through a suitable photolithographic process and an etching process so as to form a first patterned layer 33. It should be noted that there may be another layer, such as a pad layer or another hard mask layer, disposed on or under the hard mask layer 32, but not limited thereto.

The above-mentioned substrate 30 may be a semiconductor substrate (such as a silicon substrate), a silicon containing substrate (such as a silicon carbide substrate), a III-V group-on-silicon (such as GaN-on-silicon) substrate, a graphene-on-silicon substrate, a silicon-on-insulator (SOI) substrate or an epitaxial layer containing substrate. The target layer 31 may be a semiconductor layer made of materials the same as or different from that of the underlying substrate 30. The hard mask layer 32 are made of a dielectric layer, such as silicon oxide layer or a silicon nitride layer, but not limited thereto. The sacrificial layer may be made of silicon material, III-V group semiconductors or other suitable semiconductor materials, and preferably be made of polysilicon material.

It should be note that the layout of the first patterned layer 33 depicted in FIG. 3 is similar to that depicted in FIG. 2 That is to say, a mandrel patterns 22' consisting of straight line patterns 26' and L-shaped patterns 28' and dummy mandrel patterns 24' are formed in the first patterned layer 33. Additionally, since the mandrel patterns 22 and the dummy mandrel patterns 24 are corrected in the corresponding OPC process, the straight line patterns 24' and 26' and the L-shaped patterns 28' formed in the first patterned layer 33 would be more close to perfect straight line patterns and perfect L-shaped patterns that is originally stored in the computer database.

After step S140 is completed, step S150 is then carried out. In step S150, spacers 34 and 34' are formed on the sidewalls of the first patterned layer 33 through deposition and etching process. Through step S150, loop-shaped patterns (not shown) consisting of loop-shaped feature patterns 36 and loop-shaped dummy patterns 38 are formed on the sidewalls of the first patterned layer 33. More precisely, the loop-shaped feature patterns 36 and loop-shaped dummy patterns 38 may respectively surround the mandrel patterns 22' and the dummy mandrel patterns 24'. Furthermore, each of the loop-shaped feature patterns 36 and the loop-shaped dummy patterns 38 may be further divided into two portions, such as major portions 34a and 34'a and redundancy portions 34b and 34'b. The layout of the major portions 34a may be used to define active regions of the corresponding semiconductor devices and the redundancy portions 34b and 34'b may be removed in the following etching process.

Still referring to FIG. 3, patterns within the first patterned layer 33 may be distributed with suitable spacings in order to meet the requirements of the minimum rule according to corresponding photolithographic process. Preferably, the spacings 51 among the mandrel patterns 22' are smaller than or equal to the minimum design rule. Besides, the critical dimension of the mandrel patterns 22' and the dummy mandrel patterns 24' are preferably larger than that of the spacers 34 and 34'. In other words, the widths W1 of the mandrel patterns 22' and the dummy mandrel patterns 24' are preferably wider than the widths W2 of the spacers 34 and 34'.

Figure 5:
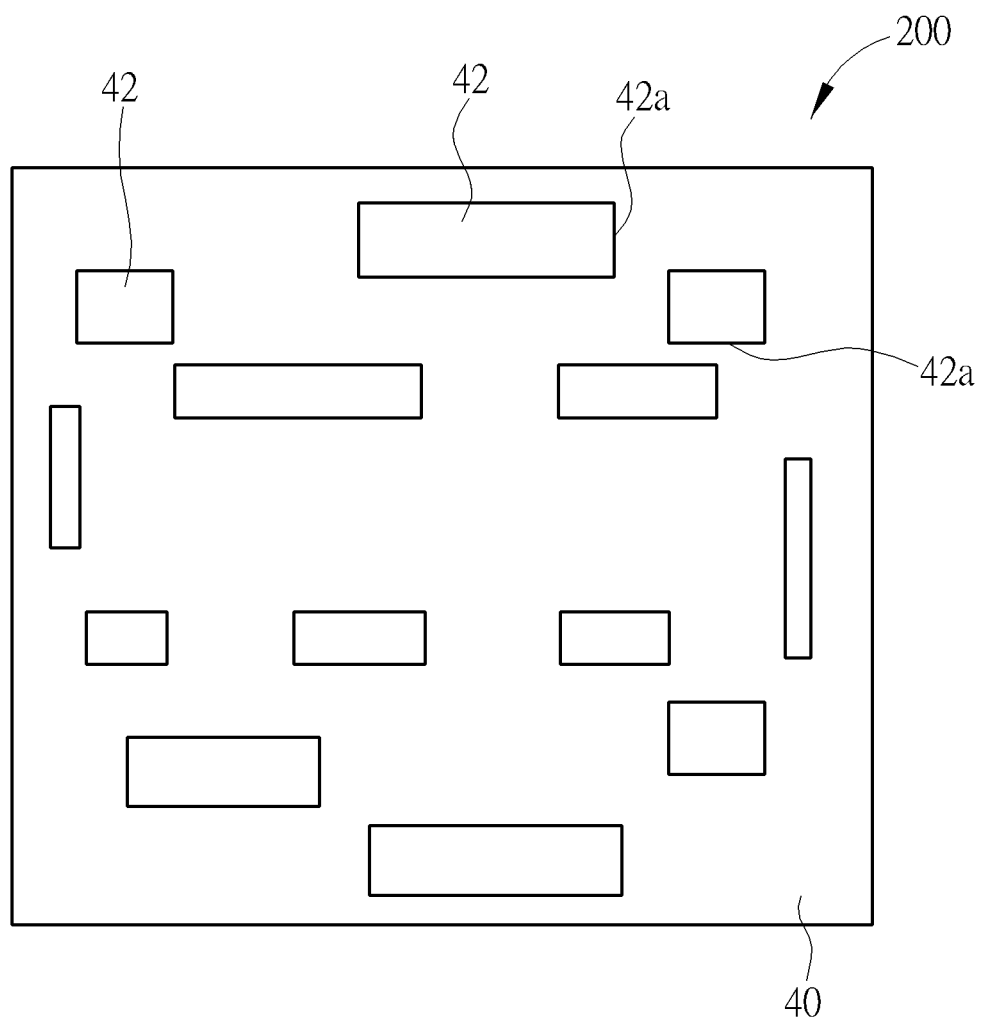
Figure 6:
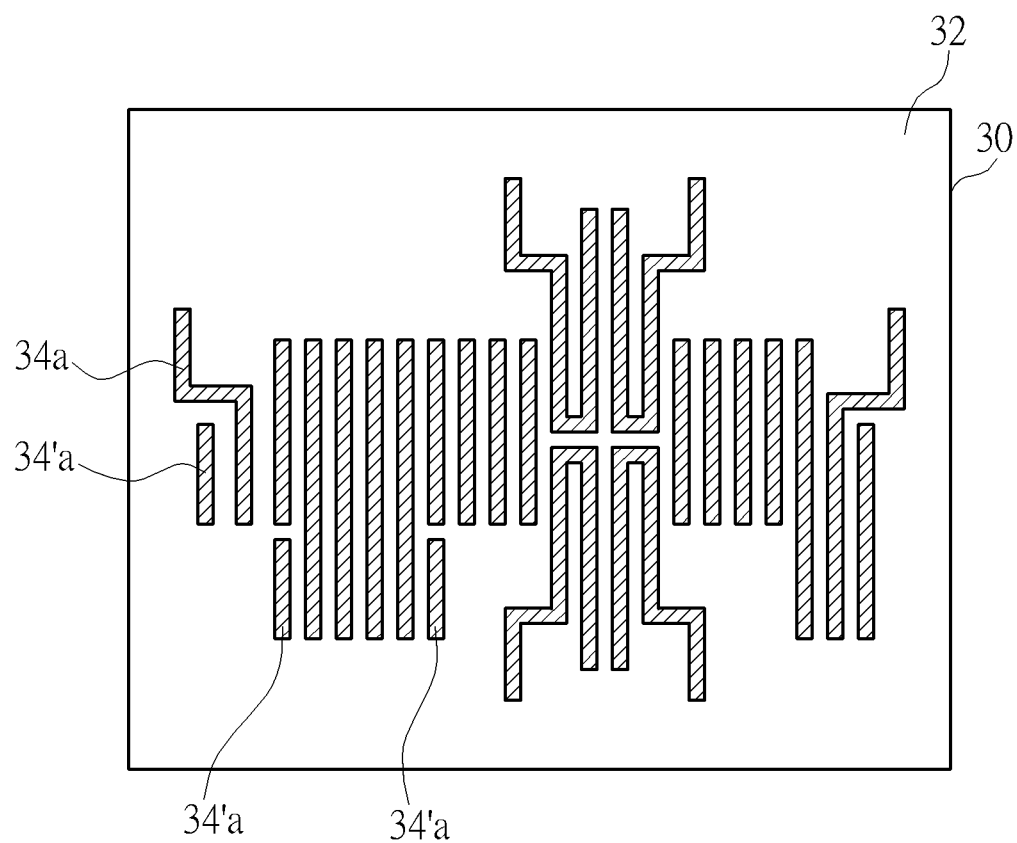

After the formation of the spacers 34, all or portions of the first patterned layer 33 may be optionally removed through suitable etching processes. Then, please refer to FIG. 5 and FIG. 6. FIG. 5 is a schematic diagram showing a second mask with a second layout pattern. FIG. 6 is a schematic diagram showing a layout pattern on a substrate after transferring the second layout pattern. In step S160, portions of the spacers 34 and 34' are removed by transferring geometric patterns 42 shown in FIG. 5. For example, after the structure shown in FIG. 3 and FIG. 4 is fabricated, a patterned photoresist layer (not shown) may be formed on the spacers 34 through at least a photolithographic process. More precisely, the patterned photoresist layer may have a layout pattern almost identical to the second layout pattern 200 formed on the second mask, but not limited thereto. Besides, the second layout pattern 200 may further include printable dummy geometric patterns (not shown) or non-printable dummy geometric patterns (not shown) which are separately disposed apart from the geometric patterns 42. These dummy geometric patterns may be used to remove portions of the mandrel patterns 22' or dummy mandrel patterns 24', but not limited thereto. Preferably, the positions of the geometric patterns 42 or the dummy geometric patterns may correspond to those of the spacers 34 and 34'. In one case, the geometric patterns 42 in the patterned photoresist layer may expose the redundancy portion 34b and 34'b of the spacers 34 and 34'. In another case, the edges of the geometric patterns 42 in the patterned photoresist layer may partially align with the edges of the mandrel patterns 22' and the dummy mandrel patterns 24'. In the subsequent etching process, mere the redundancy portions 34b and 34'b of the spacers 34 and 34' are removed and the structure shown in FIG. 6 is therefore obtained.

Figure 7:
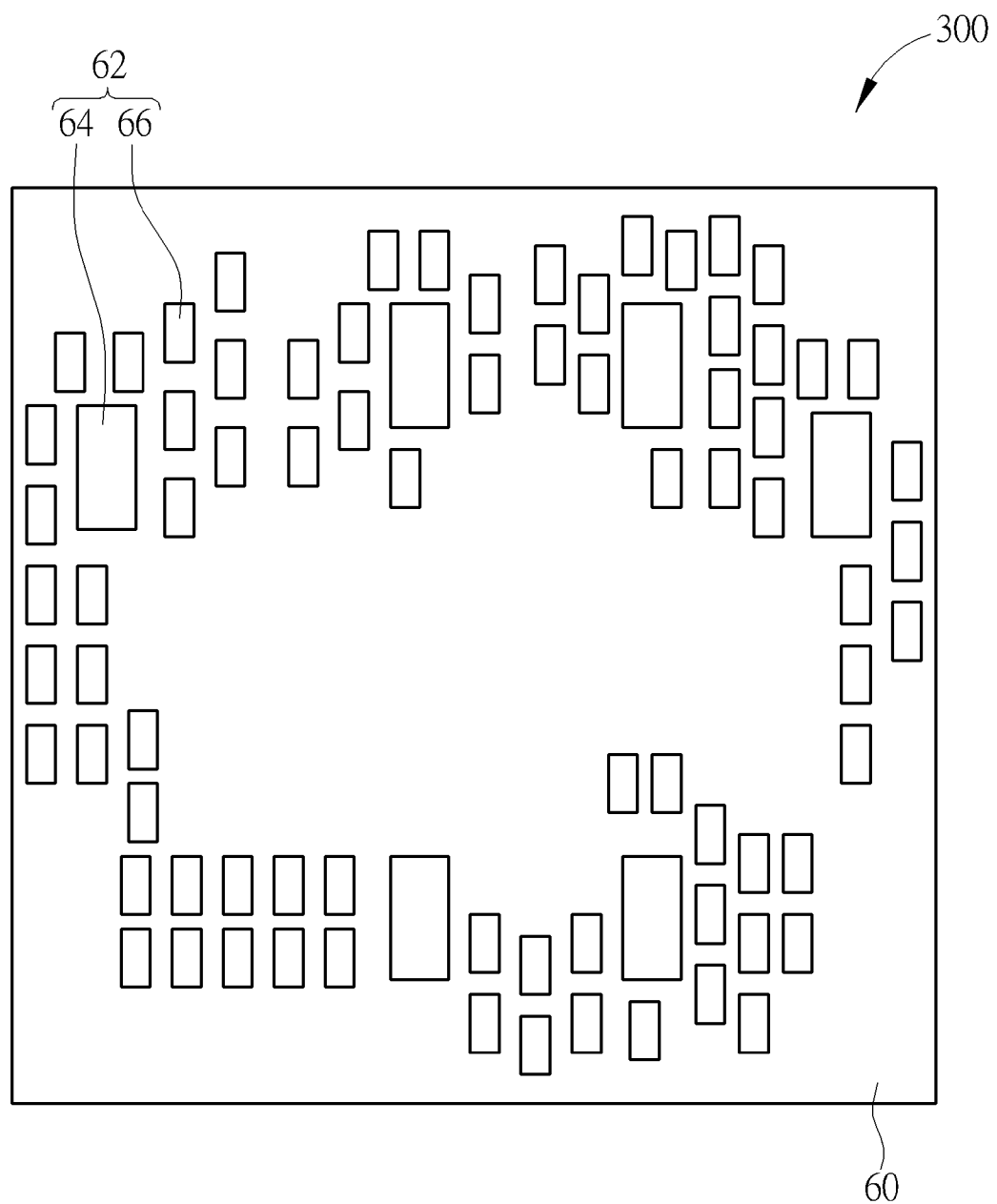

Please refer to FIG. 7. FIG. 7 is a schematic diagram showing a third mask with a third layout pattern. As depicted in FIG. 7, the third layout pattern 300 includes geometric patterns 62 consisting of pad patterns 64 and dummy pad patterns 66. In addition, the shapes of the pad patterns 64 and the dummy pad patterns 66 are rectangles, but not limited thereto; their shapes may also be squares, circles or ellipses. Preferably, the dimensions of the pad patterns 64 are larger than those of the dummy pad patterns 66. More preferably, the dimensions of the dummy pad patterns 66 are larger than those of the mandrel patterns 22, the dummy mandrel patterns 24, and/or dummy geometric patterns. According to this embodiment, all the dummy pad patterns 66 shown in FIG. 7 are printable according to this embodiment. However, in another case, some of the dummy pad patterns may be non-printable so that they would not be transferred to a layer on or over the substrate in the following process. Besides, the dummy pad patterns 66 are preferably designed without overlaying any pattern in the previous masks, such as mandrel patterns and dummy mandrel patterns. It should be noted that, since the third pattern layout 300 is also corrected by the OPC process, the pad patterns 64 and the dummy pad patterns 66 formed on the third mask 60 cannot be exactly the same as those later formed on the substrate and they may have slightly widened line ends and slightly inwards and/or outwards corners instead.

Figure 8:
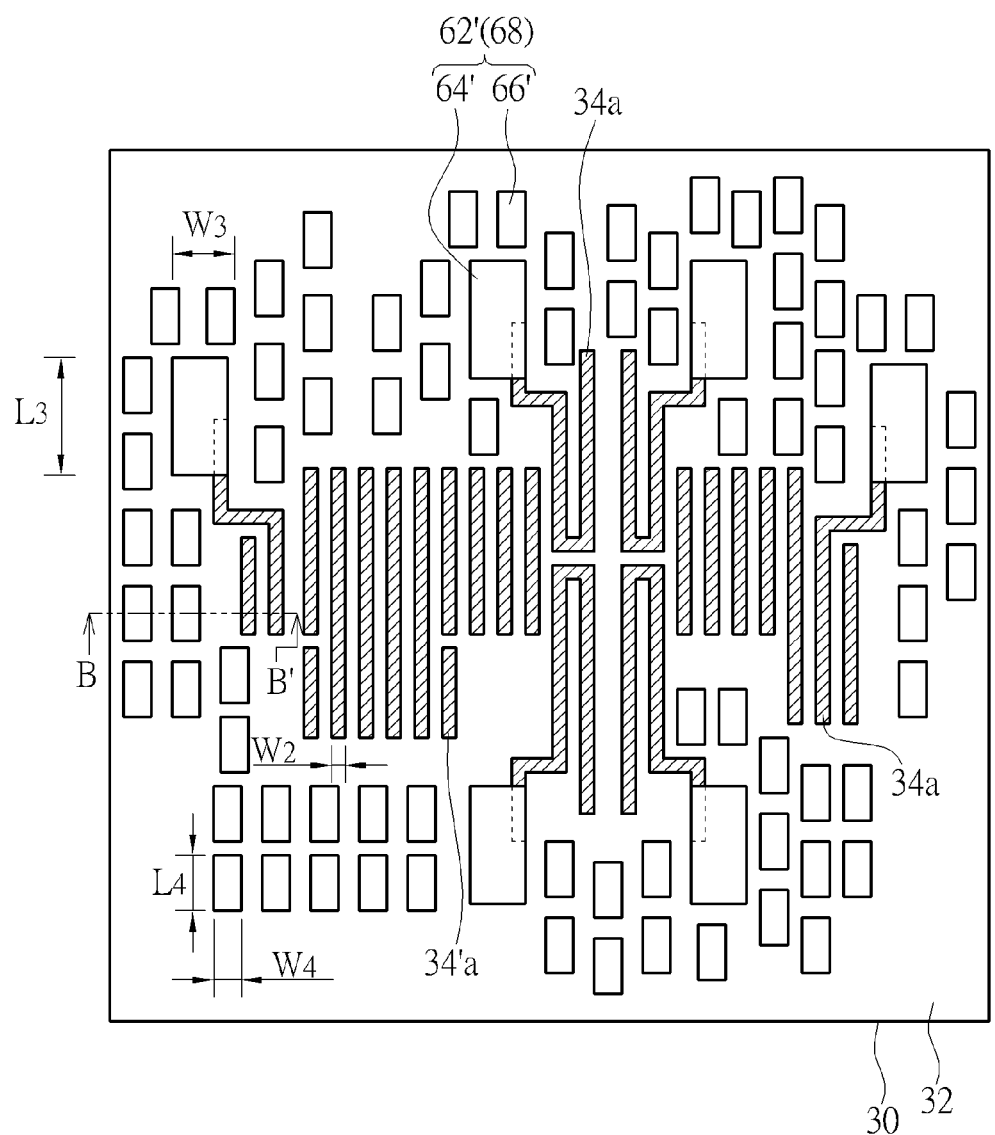
Figure 9:
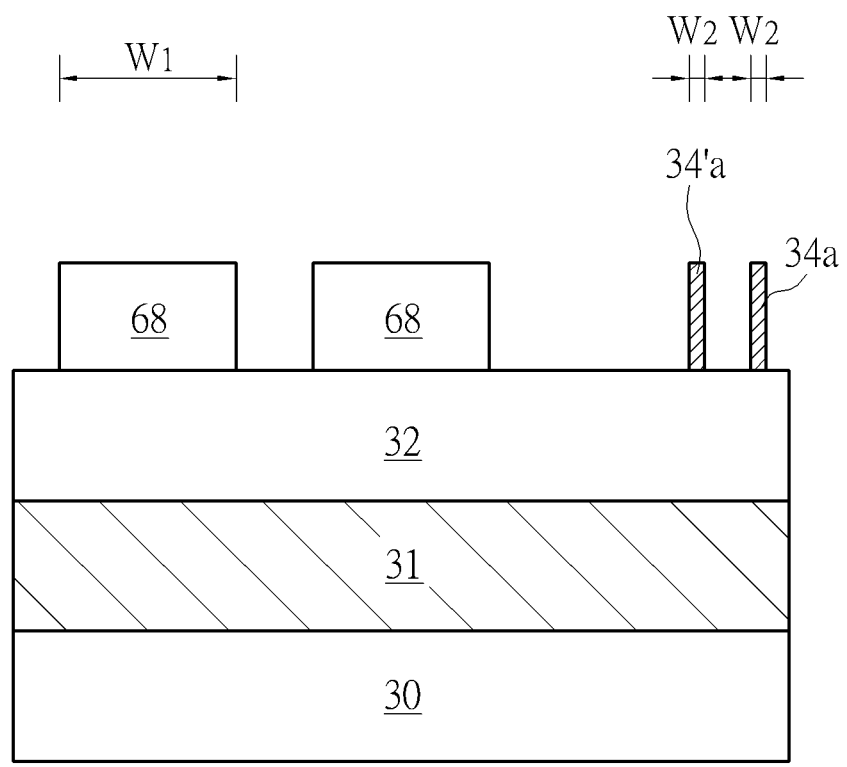

Please refer to FIG. 8 and FIG. 9. FIG. 8 is schematic diagram showing a layout pattern on a substrate after transferring a third layout pattern. FIG. 9 is schematic cross-sectional diagram taken along a line B-B' in FIG. 8. As depicted in FIG. 8 and FIG. 9, in step S170, the third layout pattern 300 formed on the third mask layer 60 is transferred to a layer, such as a photoresist layer, over the substrate 30 so as to form a second patterned layer 68. Similarly, the layout of the second patterned layer 68 depicted in FIG. 8 is similar to that depicted in FIG. 7. That is to say, the geometric patterns 62' consisting of pad patterns 64' and dummy pad patterns 66' are formed in the second patterned layer 68. Besides, since the pad patterns 64 and dummy pad patterns 66 are corrected in the corresponding OPC process, the pad patterns 64' and dummy pad patterns 66' defined in the second patterned layer 68 would be more close to perfect pad patterns and dummy patterns originally stored in the computer database. Still referring to FIG. 8 and FIG. 9, when the second patterned layer 68 is made of photoresist, the pad patterns 64' may cover portions of the loop-shaped patterns and especially cover portions of the major portion 34a. According to this embodiment, the dummy pad patterns 66' may be uniformly distributed around a periphery of major portion 34a of the loop-shaped feature patterns and the major portion 34'a of the loop-shaped dummy patterns. That is to say, the dummy pad patterns 66' do not cover or overlay any major portion 34a and 34'a.

It should be noted that patterns within the second patterned layer 68 may be distributed with suitable spacings in order to meet the requirements of the minimum rule according to corresponding photolithographic process. Preferably, the spacings S2 among the geometric patterns 62' are at least 5 times greater than the minimum design rule. In addition, the second patterned layer 68 preferably has a critical dimension greater than that of the first patterned layer 33 and the spacers 34 and more preferably larger than 1 micrometer. That is to say, the widths W3 and W4 of the second patterned layer 68 are wider than the widths W1 and W2 of the first patterned layer 33 and the spacers 34. Furthermore, the lengths L3 of the pad patterns 64' may be longer than the lengths L4 of the dummy pad patterns 66'.

Figure 10:
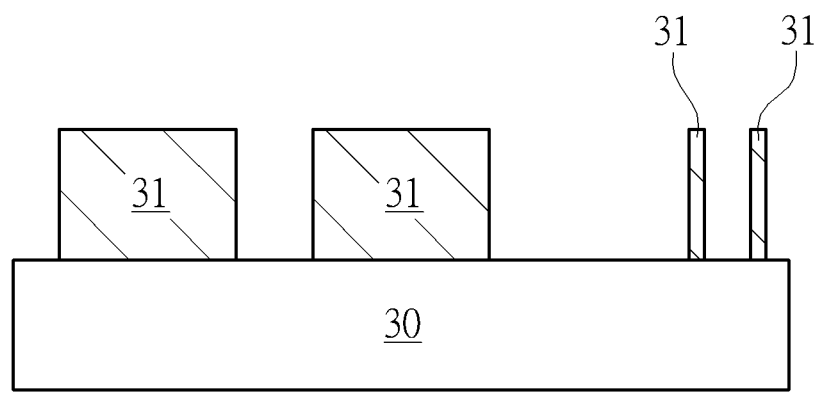
Figure 11:
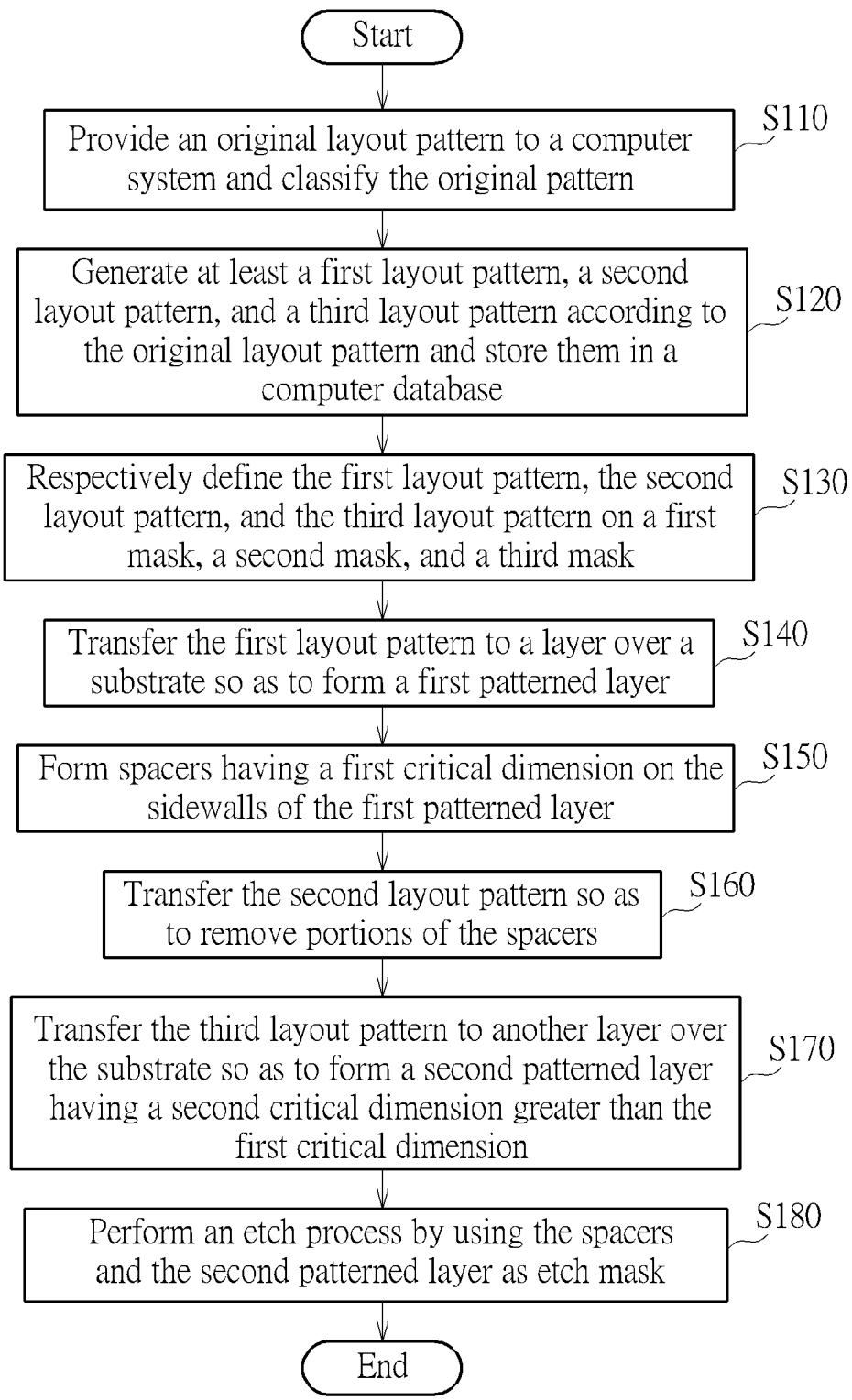
FIG. 11 is a simplified flowchart showing a method for forming a layout pattern on a substrate according to embodiments of the present invention.

Please refer to FIG. 10. Finally, in step S180, at least a suitable etching process, such as an anisotropic etching process, may be carried out by using the major portions 34a and 34'a of the spacers 34 and 34' and the second patterned layer 68 as etch mask. In this way, the layout pattern consisting of the major portions 34a and 34'a and the second patterned layer 68 may be further transferred to the target layer 31' and therefore form a patterned layer 31' on the substrate 30. According to this embodiment, the layout of the patterned layer 31' may correspond to a layout of semiconductor devices, such as FinFET devices, but not limited thereto.

In summary, the embodiments of the present invention provide a method for forming a layout pattern. According to these embodiments, the dummy patterns with different dimensions are distributed over different individual photomasks and these dummy patterns with different dimensions may be transferred to the target layer concurrently. In this way, the fabrication process can be therefore more effective and the corresponding process window is therefore enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a layout pattern, comprising the steps of:
   (a) forming a plurality of loop-shaped patterns in a layer over a substrate, wherein the loop-shaped patterns comprise a plurality of loop-shaped feature patterns belonging to the layout pattern and a plurality of loop-shaped dummy patterns not belonging to the layout pattern, and the loop-shaped feature patterns and the loop-shaped dummy patterns have a first dimension; and
   (b) after the step (a), forming a plurality of geometric patterns in another layer over the substrate, wherein the geometric patterns comprises a plurality of pad patterns belonging to the layout pattern and a plurality of dummy pad patterns not belonging to the layout pattern, and the dummy pad patterns have a second dimension, wherein the second dimension is greater than the first dimension.

2. The method of claim 1, wherein shapes of the dummy pad patterns are rectangles.

3. The method of claim 1, wherein the geometric patterns covers portions of the loop-shaped patterns.

4. The method of claim 1, wherein the geometric patterns are made of photoresist.

5. The method of claim 1, wherein the second dimension is greater than 1 micrometer.

6. The method of claim 1, wherein the pad patterns overlap portions of the loop-shaped feature patterns.

7. The method of claim 1, wherein the dummy pad patterns are uniformly distributed around a periphery of the loop-shaped feature patterns and the loop-shaped dummy patterns.

8. The method of claim 1, further comprising a step of (c) transferring the loop-shaped patterns and the geometric patterns into a target layer on the substrate.

9. The method of claim 8, wherein the step (c) comprises an anisotropic etching process.

10. The method of claim 1, wherein dimension of each of the pad patterns is greater than dimension of each of the dummy pad patterns.

11. The method of claim 10, wherein a plurality of the dummy pad patterns are uniformly distributed around a periphery of each of the pad patterns.

* * * * *